US011309873B2

(12) United States Patent
Liu

(10) Patent No.: US 11,309,873 B2
(45) Date of Patent: Apr. 19, 2022

(54) VOLTAGE LEVEL CONVERSION CIRCUIT

(71) Applicant: REALTEK SEMICONDUCTOR CORPORATION, Hsinchu (TW)

(72) Inventor: Tsung-Yen Liu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/229,295

(22) Filed: Apr. 13, 2021

(65) Prior Publication Data

US 2021/0328581 A1    Oct. 21, 2021

(30) Foreign Application Priority Data

Apr. 17, 2020   (TW) ................................. 109112905

(51) Int. Cl.
*H03L 5/00*     (2006.01)
*H03K 3/037*    (2006.01)
*H03K 19/0185*  (2006.01)

(52) U.S. Cl.
CPC ..... *H03K 3/037* (2013.01); *H03K 19/018521* (2013.01)

(58) Field of Classification Search
CPC ..... H03K 19/018521; H03K 3/356113; H03K 19/00315; H03K 17/102; H03K 3/012
USPC ........................................................ 327/333
See application file for complete search history.

(56) References Cited

U.S. PATENT DOCUMENTS 7,026,855 B2 * 4/2006 Sueoka ............ H03K 3/356182
                                                326/68
7,458,615 B2 * 12/2008 White ................... A61M 16/08
                                                285/272
7,675,345 B2 * 3/2010 Fayed .................... H03K 3/012
                                                327/333

(Continued)

FOREIGN PATENT DOCUMENTS

TW        201937500 A    9/2019

OTHER PUBLICATIONS

1) OA letter of the counterpart TW application (appl. No. 109112905) mailed on Apr. 30, 2020. 2) Summary of the OA letter: 1. Claims 1~2 and 9~10 are rejected as being anticipated by the disclosure of the cited reference 1 (US 20020024374 A1). 2. Claim 8 are rejected as being unpatentable over the disclosure of the cited reference 1 and the cited reference 2 (TW 201937500 A, also published as US2019267998A1). 3. Claims 3~7 are allowed.

*Primary Examiner* — Quan Tra
(74) *Attorney, Agent, or Firm* — WPAT, PC

(57) ABSTRACT

The present invention discloses a voltage level conversion circuit. A first and a second N-type driving transistors turn on when a first power voltage source supplies a high state voltage. A voltage transmission circuit transmits a first and a second input voltages having opposite levels to sources of the first and the second N-type driving transistors. A current source operates according to a second supply voltage source and has a first and a second output terminals. A first and a second connection transistors respectively couple between the drain of the first N-type driving transistor and the second output terminal and between the drain of the second N-type driving transistor and the first output terminal. The first and the second connection transistors turn on and off when the first voltage supply source supplies the high state voltage and a low state voltage.

9 Claims, 3 Drawing Sheets

(56) References Cited

U.S. PATENT DOCUMENTS

| | | | |
|---|---|---|---|
| 8,384,431 B2* | 2/2013 | Barrow | H03K 3/35613 |
| | | | 326/68 |
| 2002/0024374 A1 | 2/2002 | Ovens et al. | |
| 2009/0027101 A1* | 1/2009 | Nagayama | H03K 3/35613 |
| | | | 327/333 |
| 2009/0085637 A1* | 4/2009 | Hsu | H03K 19/0175 |
| | | | 327/333 |
| 2013/0113541 A1* | 5/2013 | Crespi | H03K 3/356182 |
| | | | 327/333 |
| 2019/0267998 A1 | 8/2019 | Okabe | |

* cited by examiner

VOLTAGE LEVEL CONVERSION CIRCUIT

BACKGROUND OF THE INVENTION

1. Field of the Invention

The present invention relates to a voltage level conversion circuit.

2. Description of Related Art

An integrated circuit device may include two or three power supply sources having different voltage levels so that the integrated circuit device operates accordingly. As a result, converters that perform conversion between different voltage levels are required for the signal transmission between circuit blocks that operate according to different voltage levels from different power supply sources. According to the requirements, the converters either convert a voltage from a low level to a high level, or from a high level to a low level.

However, the current voltage converters are affected by parasitic capacitors and the operation speed thereof is thus limited. Further, in some usage scenarios, the power supply sources that the voltage converters operate accordingly may generate leakage currents if some components of the voltage converters do not fully turn off. Furthermore, when the voltage converters begin to operate, an unstable voltage value of the output voltage may be generated due to the unstable operation condition.

SUMMARY OF THE INVENTION

In consideration of the problem of the prior art, an object of the present invention is to supply a voltage level conversion circuit.

The present invention discloses a voltage level conversion circuit, comprising: a first N-type driving transistor, a second N-type driving transistor, a voltage transmission circuit, a current source, a first connection transistor and a second connection transistor. Each of the first N-type driving transistor and the second N-type driving transistor includes a gate, a drain and a source, wherein the gate is electrically couple to a first power supply source such that the first N-type driving transistor and the second N-type driving transistor turn on when the first power voltage source supplies a first high state voltage. The voltage transmission circuit is configured to transmit a first input voltage to the source of the first N-type driving transistor, and transmit a second input voltage to the source of the second N-type driving transistor, wherein levels of the first input voltage and the second input voltage are opposite to each other. The current source is configured to operate according to a second high state voltage supplied by a second supply voltage source, and having a first output terminal and a second output terminal. The first connection transistor is electrically coupled between the drain of the first N-type driving transistor and the second output terminal, and the second connection transistor is electrically coupled between the drain of the second N-type driving transistor and the first output terminal. The first connection transistor and the second connection transistor are controlled by an enabling voltage such that the first connection transistor and the second connection transistor turn on when the first power supply source supplies the first high state voltage to generate an output voltage, and turn off when the first power supply source supplies a low state voltage.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to supply a voltage level conversion circuit having a leakage current prevention mechanism to decrease the effect of the parasitic capacitors so as to obtain a faster operation speed. Further the voltage level conversion circuit can supply a default stable output voltage when the power supply source is unstable.

Figure 1:
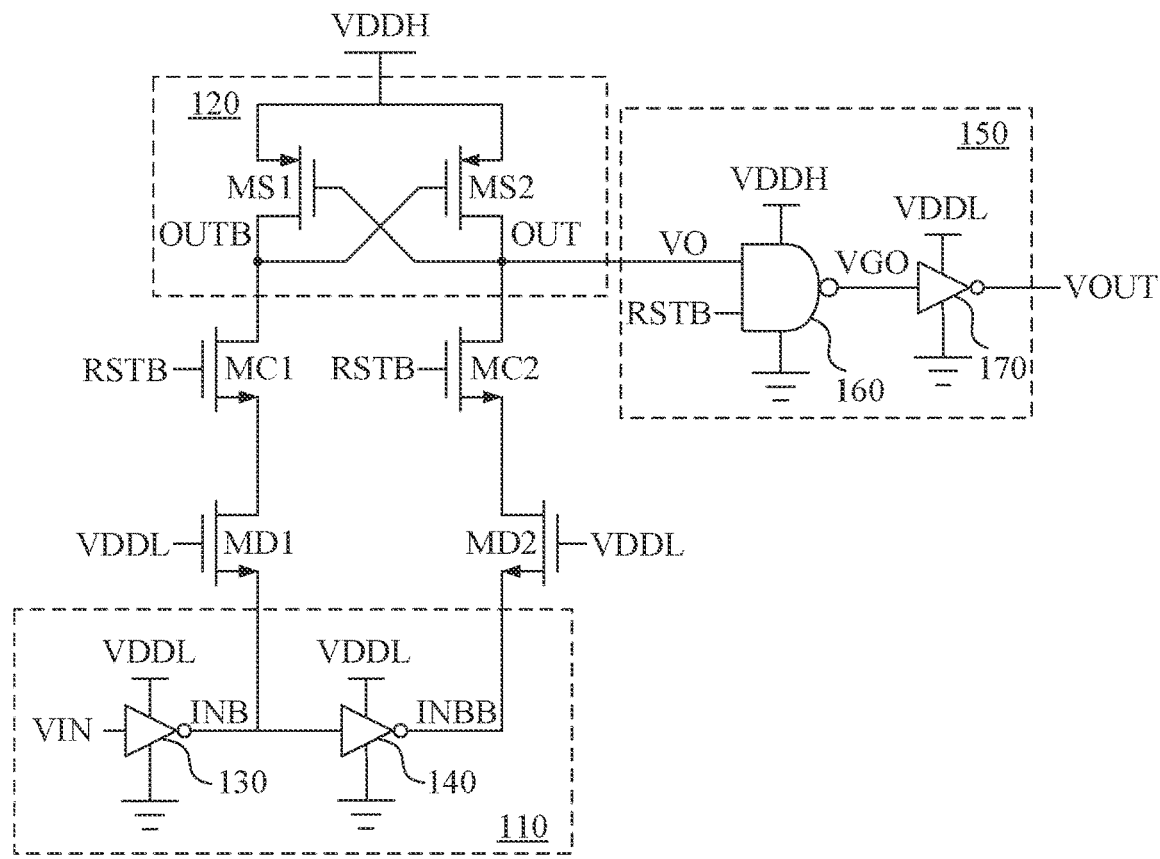
FIG. 1 illustrates a circuit diagram of a voltage level conversion circuit according to an embodiment of the present invention.

Reference is now made to FIG. 1. FIG. 1 illustrates a circuit diagram of a voltage level conversion circuit 100 according to an embodiment of the present invention. The voltage level conversion circuit 100 is configured to perform voltage conversion on an actual input voltage VIN having a first voltage level to generate an actual output voltage VOUT having a second voltage level.

The voltage level conversion circuit 100 includes a first N-type driving transistor MD1, a second N-type driving transistor MD2, a voltage transmission circuit 110, a current source 120, a first connection transistor MC1 and a second connection transistor MC2.

Each of the first N-type driving transistor MD1 and the second N-type driving transistor MD2 includes a gate, a drain and a source. The gates of the first N-type driving transistor MD1 and the second N-type driving transistor MD2 are electrically coupled to a first power supply source VDDL. As a result, the first N-type driving transistor MD1 and the second N-type driving transistor MD2 turn on when the first power supply source VDDL supplies a high state voltage, and turn off when the first power supply source VDDL supplies a low state voltage.

The voltage transmission circuit 110 is configured to transmit a first input voltage INB to the source of the first N-type driving transistor MD1, and transmit a second input voltage INBB to the source of the second N-type driving transistor MD2. The levels of the first input voltage IN and the second input voltage INBB are opposite to each other.

In an embodiment, the voltage transmission circuit 110 includes a first inverter 130 and a second inverter 140. The first inverter 130 is configured to receive the actual input voltage VIN to generate the first input voltage INB. The second inverter 140 is configured to receive the first input voltage INB to generate the second input voltage INBB. The first inverter 130 and the second inverter 140 operate according to the first high state voltage supplied by the first power supply source VDDL.

The current source 120 is configured to operate according to the high state voltage supplied by the second power supply source VDDH. The current source 120 includes a first output terminal OUT and a second output terminal OUTB. In an embodiment, the high state voltage supplied by the second power supply source VDDH is larger than the high state voltage supplied by the first power supply source VDDL. In a numerical example, the high state voltage supplied by the second power supply source VDDH is such as, but not limited to 3.3 volts. The high state voltage supplied by the first power supply source VDDL is such as, but not limited to 0.9 volts.

In an embodiment, the current source 120 includes a first P-type transistor MS1 and a second P-type transistor MS2. The first P-type transistor MS1 includes a gate, a drain and a source. The gate is electrically coupled to the first output terminal OUT, the source is electrically coupled to the second power supply source VDDH, and the drain is electrically coupled to the second output terminal OUTB. The second P-type transistor MS2 also includes a gate, a drain and a source. The gate is electrically coupled to the second output terminal OUTB, the source is electrically coupled to the second power supply source VDDH, and the drain is electrically coupled to the first output terminal OUT.

The configuration of the current source 120 described above is merely an example. In other embodiments, the current source 120 can be implemented by other circuit configurations.

The first connection transistor MC1 is electrically coupled between the drain of the first N-type driving transistor MD1 and the second output terminal OUTB. The second connection transistor MC2 is electrically coupled between the drain of the second N-type driving transistor MD2 and the first output terminal OUT. The first connection transistor MC1 and the second connection transistor MC2 are controlled by an enabling voltage RSTB.

In an embodiment, the voltage state supplied by the first power supply source VDDL determines the voltage state of the enabling voltage RSTB. More specifically, when each of the first connection transistor MC1 and the second connection transistor MC2 is implemented by an N-type transistor, the enabling voltage RSTB is at the high state when the first power supply source VDDL supplies the high state voltage. As a result, the first connection transistor MC1 and the second connection transistor MC2 turn on accordingly. When the first power supply source VDDL turns off to supply the low state voltage, the enabling voltage RSTB becomes a low state. The first connection transistor MC1 and the second connection transistor MC2 turn off accordingly.

Figure 2:
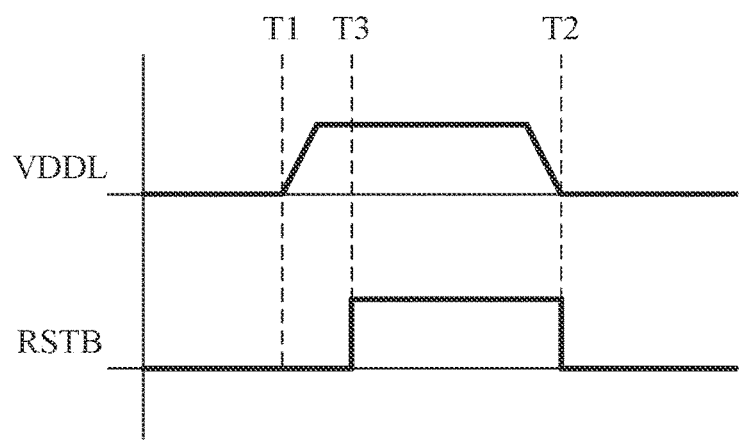
FIG. 2 illustrates a waveform diagram of the voltage supplied by the first power supply source and the enabling voltage according to an embodiment of the present invention.

Reference is now made to FIG. 2. FIG. 2 illustrates a waveform diagram of the voltage supplied by the first power supply source VDDL and the enabling voltage RSTB according to an embodiment of the present invention. The voltage supplied by the first power supply source VDDL is still labeled as VDDL in FIG. 2.

As illustrated in FIG. 2, the first power supply source VDDL turns off before the time spot T1 to supply the low state voltage. After the time spot T1, the first power supply source VDDL starts to operate to supply the high state voltage, and turns off again at the time spot T2 to supply the low state voltage again.

In an embodiment, the enabling voltage RSTB is at a disabling state (which is a low state in the present embodiment) before the time spot T1 when the first power supply source VDDL supplies the low state voltage. After the first power supply source VDDL starts to supply the first high state voltage for a predetermined time period, e.g. the time spot T3 that the high state voltage become stable, the enabling voltage RSTB switches to an enabling state (which is a high state in the present embodiment). After the time spot T2, the first power supply source VDDL returns to the low state voltage. The enabling voltage RSTB switches to the disabling state immediately.

By using such a design, when the voltage level conversion circuit 100 operates under a usage scenario having the second power supply source VDDH operating and the first power supply source VDDL turning off, the occurrence of the leakage current can be avoided.

The operation of the voltage level conversion circuit 100 under the condition that both of the first power supply source VDDL and the second power supply source VDDH supply power normally is described in detail in the following paragraphs.

When the actual input voltage VIN is at the high state, the voltage transmission circuit 110 respectively transmits the first input voltage INB having the low state to the source of the first N-type driving transistor MD1, and transmits the second input voltage INBB having the high state to the source of the second N-type driving transistor MD2.

Since the first power supply source VDDL supplies the high state voltage such that the enabling voltage RSTB is at the high state, the first N-type driving transistor MD1, the second N-type driving transistor MD2, the first connection transistor MC1 and the second connection transistor MC2 all turn on.

The first N-type driving transistor MD1 and the first connection transistor MC1 transmit the first input voltage INB having the low state to the second output terminal OUTB. The second N-type driving transistor MD2 and the second connection transistor MC2 transmit the second input voltage INBB having the high state to the first output terminal OUT. The first output terminal OUT generates the output voltage VO accordingly.

Since the output voltage VO is generated according to the second input voltage INBB, and the second input voltage INBB is generated from the actual input voltage VIN through the first inverter 130 and the second inverter 140, the output voltage VO has the high state voltage that is the same as the actual input voltage VIN.

Identically, when the actual input voltage VIN is at the low state, the voltage transmission circuit 110 respectively transmits the first input voltage INB having the high state to the source of the first N-type driving transistor MD1, and transmits the second input voltage INBB having the low state to the source of the second N-type driving transistor MD2.

Since the operation of the first N-type driving transistor MD1, the second N-type driving transistor MD2, the first connection transistor MC1 and the second connection transistor MC2 is controlled by the high state voltage supplied by the first power supply source VDDL and the high state of the enabling voltage RSTB, the first input voltage INB having the high state is transmitted to the second output terminal OUTB through the first N-type driving transistor MD1 and the first connection transistor MC1 that both turn on. The second input voltage INBB having the low state, is transmitted to the first output terminal OUT through the second N-type driving transistor MD2 and the second connection transistor MC2 that both turn on.

Since the output voltage VO is generated according to the second input voltage INBB, and the second input voltage INBB is generated from the actual input voltage VIN through the first inverter 130 and the second inverter 140, the output voltage VO has the low voltage that is the same as the actual input voltage VIN.

However, it is appreciated that since the voltage transmission circuit 110 operates according to the first power supply source VDDL, the current source 120 operates according to the second power supply source VDDH, and the high state voltage supplied by the second power supply source VDDH is larger than the high state voltage supplied by the first power supply source VDDL, the high state voltage of the output voltage VO is larger than the high state voltage of the actual input voltage VIN.

In some approaches, the first N-type driving transistor MD1 and the second N-type driving transistor MD2 receive the first input voltage INB and the second input voltage INBB from the gates thereof and operate accordingly, to transmit the voltages to the second output terminal OUTB and the first output terminal OUT. Under such a condition, the parasitic capacitors between the gate and source and between the gate and drain of the first N-type driving transistor MD1 and the second N-type driving transistor MD2 affect the operation speed thereof.

In the voltage level conversion circuit 100 of the present invention, by transmitting the first input voltage INB and the second input voltage INBB through the sources and drains of the first N-type driving transistor MD1 and the second N-type driving transistor MD2 to the second output terminal OUTB and the first output terminal OUT, the first N-type driving transistor MD1 and the second N-type driving transistor MD2 are only affected by the parasitic capacitors between the gate and the source thereof. The operation speed can thus be increased.

In an embodiment, the voltage level conversion circuit 100 can directly output the output voltage VO to other circuit modules. However, in an embodiment, the voltage level conversion circuit 100 may further include an output circuit 150 to generate the actual output voltage VOUT according to the control of the enabling voltage RSTB and further output the actual output voltage VOUT to other circuit modules. The output circuit 150 outputs the output voltage VO as the actual output voltage VOUT when the first power supply source VDDL supplies the high state voltage. The output circuit 150 outputs a default voltage as the actual output voltage VOUT when the first power supply source VDDL supplies the low state voltage.

The output circuit 150 includes a NAND gate 160 and an inverter 170. The NAND gate 160 operates according to the high state voltage supplied by the second power supply source VDDH, and is configured to receive the output voltage VO and the enabling voltage RSTB to generate a gate output voltage VGO. The inverter 170 operates according to the high state voltage supplied by the second power supply source VDDH, and is configured to receive the gate output voltage VGO to generate the actual output voltage VOUT.

When the first power supply source VDDL supplies the high state voltage such that the enabling voltage RSTB is at the high state, the NAND gate 160 determines the state of the gate output voltage VGO according to the output voltage VO. The inverter 170 further inverts the state of the gate output voltage VGO to generate the actual output voltage VOUT. As a result, when the output voltage VO is at the high state, the gate output voltage VGO has the low state voltage such that the actual output voltage VOUT has the high state voltage. When the output voltage VO is at the low state, the gate output voltage VGO has the high state voltage such that the actual output voltage VOUT has the low state voltage.

On the other hand, when the first power supply source VDDL turns off and supplies the low state voltage such that the enabling voltage RSTB is at the low state, the NAND gate 160 makes the output voltage VGO become the high state voltage according to the low state of the enabling voltage RSTB. The actual output voltage VOUT thus becomes the low state voltage. As a result, under such a condition, the default voltage outputted as the actual output voltage VOUT is the low state voltage.

In some approaches, the output voltage VO is at an unstable state when the first power supply source VDDL starts to operate or turns off due to power-off. As a result, by using the output circuit 150, the voltage level conversion circuit 100 can make sure the stable default voltage to be outputted as the actual output voltage VOUT when the first power supply source VDDL turns off.

It is appreciated that the default voltage having the low state is merely an example. In an embodiment, different logic circuits can be disposed in the output circuit 150 such that the default voltage becomes the high state voltage. The present invention is not limited thereto.

Figure 3:
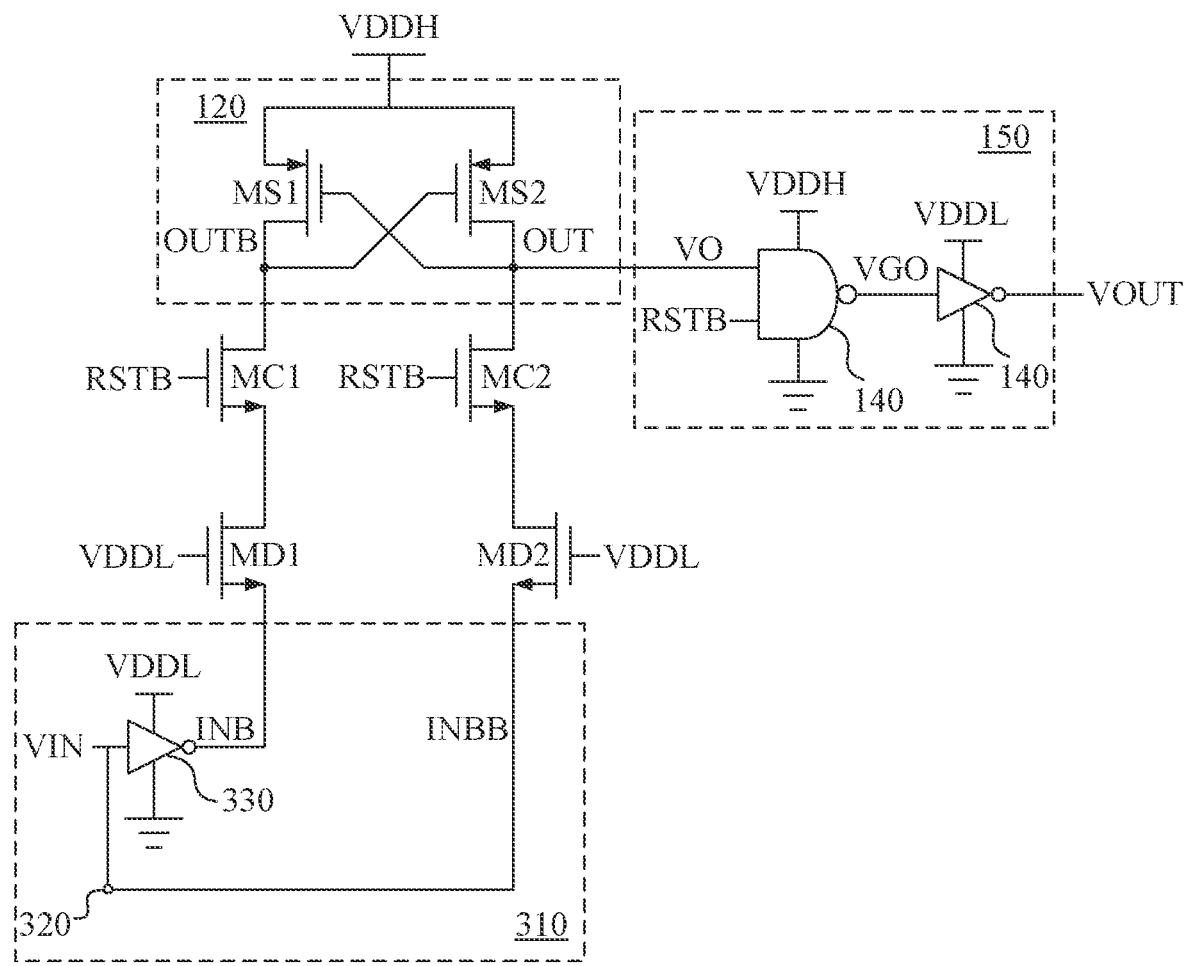
FIG. 3 illustrates a circuit diagram of a voltage level conversion circuit according to an embodiment of the present invention.

Reference is now made to FIG. 3. FIG. 3 illustrates a circuit diagram of a voltage level conversion circuit 300 according to an embodiment of the present invention. Identical to the voltage level conversion circuit 100 illustrated in FIG. 1, the voltage level conversion circuit 300 includes the first N-type driving transistor MD1, the second N-type driving transistor MD2, the current source 120, the first connection transistor MC1 and the second connection transistor MC2. The identical components are not further described herein.

In the present embodiment, the voltage level conversion circuit 300 includes a voltage transmission circuit 310. The voltage transmission circuit 310 includes a receiving terminal 320 and an inverter 330.

The receiving terminal 320 is configured to receive the actual input voltage VIN and directly output the actual input voltage VIN as the second input voltage INBB. The inverter 330 is configured to receive the actual input voltage VIN and generates the first input voltage INB. The inverter 330 operates according to the high state voltage supplied by the first power supply source VDDL.

As a result, the first N-type driving transistor MD1 and the second N-type driving transistor MD2 operate according to the high state voltage supplied by the first power supply source VDDL. The first connection transistor MC1 and the second connection transistor MC2 operate according to the high state of the enabling voltage RSTB. Based on the actual input voltage VIN, and based on and the first input voltage INB and the second input voltage INBB transmitted voltage transmission circuit 310, the first output terminal OUT can generate the output voltage VO.

Figure 4:
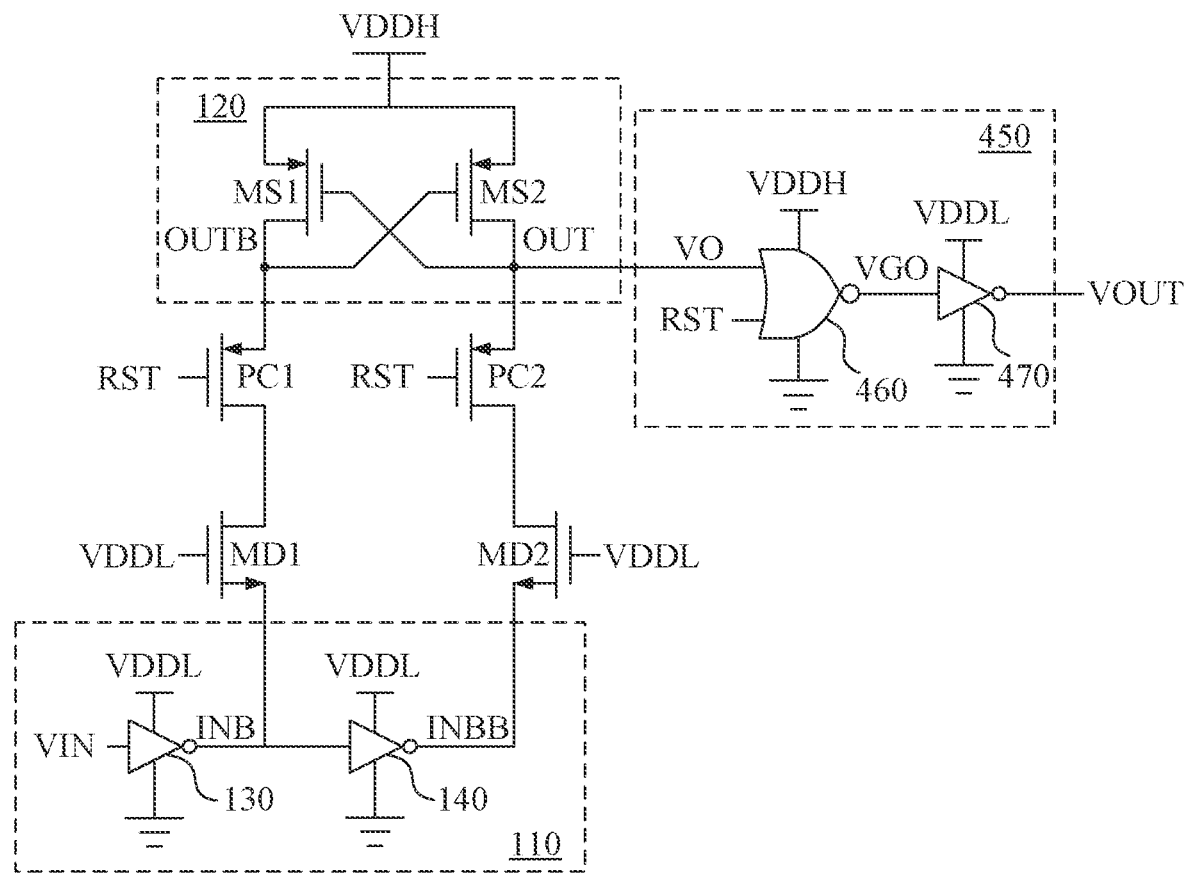
FIG. 4 illustrates a circuit diagram of a voltage level conversion circuit according to an embodiment of the present invention.

Reference is now made to FIG. 4. FIG. 4 illustrates a circuit diagram of a voltage level conversion circuit 400 according to an embodiment of the present invention. Identical to the voltage level conversion circuit 100 illustrated in FIG. 1, the voltage level conversion circuit 400 includes the first N-type driving transistor MD1, the second N-type driving transistor MD2, the voltage transmission circuit 110 and the current source 120. The identical components are not further described herein.

In the present embodiment, the voltage level conversion circuit 400 includes a first connection transistor PC1 and a second connection transistor PC2. The first connection transistor PC1 is electrically coupled between the drain of the first N-type driving transistor MD1 and the second output terminal OUTB. The second connection transistor PC2 is electrically coupled between the drain of the second N-type driving transistor MD2 and the first output terminal OUT. The first connection transistor PC1 and the second connection transistor PC2 are controlled by the enabling voltage RST.

In an embodiment, the voltage state supplied by the first power supply source VDDL determines the voltage state of the enabling voltage RST. More specifically, when each of the first connection transistor PC1 and the second connection transistor PC2 is implemented by a P-type transistor, the enabling voltage RST is at the low state when the first power supply source VDDL supplies the high state voltage. The first connection transistor PC1 and the second connection transistor PC2 turn on accordingly. The enabling voltage RST is at the low state when the first power supply source VDDL turns off and supply the low state voltage. The first connection transistor PC1 and the second connection transistor PC2 turn off accordingly.

As a result, the first connection transistor PC1 and the second connection transistor PC2 can also prevent the generation of the leakage current under the condition that the second power supply source VDDH keeps operating while the first power supply source VDDL turns off at the same time.

In the present embodiment, the voltage level conversion circuit may further includes an output circuit 450. The output circuit 450 generates the actual output voltage VOUT under the control of the enabling voltage RST. The output voltage VO is outputted as the actual output voltage VOUT when the first power supply source VDDL supplies the high state voltage. The default voltage is outputted as the actual output voltage VOUT when the first power supply source VDDL supplies the low state voltage.

The output circuit 450 includes a NOR gate 460 and an inverter 470. The NOR gate 460 operates according to the high state voltage supplied by the second power supply source VDDH, and is configured to receive the output voltage VO and the enabling voltage RST to generate the gate output voltage VGO. The inverter 470 operates according to the high state voltage supplied by the second power supply source VDDH, and is configured to receive the gate output voltage VGO and generate the actual output voltage VOUT.

When the first power supply source VDDL supplies the high state voltage normally such that the enabling voltage RST becomes the low state, the NOR gate 460 determine the state of the gate output voltage VGO according to the output voltage VO. The inverter 470 further inverts the state of the gate output voltage VGO to generate the actual output voltage VOUT. As a result, when the output voltage VO is at the high state, the gate output voltage VGO has the low state voltage such that the actual output voltage VOUT has the high state voltage. When the output voltage VO is at the low state, the gate output voltage VGO has the high state voltage such that the actual output voltage VOUT has the low state voltage.

On the other hand, when the first power supply source VDDL turns off and supplies the low state voltage such that the enabling voltage RST is at the high state, the NOR gate 460 makes the output voltage VGO become the high state voltage according to the high state of the enabling voltage RST. The actual output voltage VOUT thus becomes the low state voltage. As a result, under such a condition, the default voltage outputted as the actual output voltage VOUT is the low state voltage.

As a result, the voltage level conversion circuit 400 can be selectively implemented by the first connection transistor PC1 and the second connection transistor PC2, each being a P-type transistor. Further, the enabling voltage RST is used to turn on or turn off the first connection transistor PC1 and the second connection transistor PC2 and control the output circuit 450.

It is appreciated that the embodiments described above are merely an example. In other embodiments, it should be appreciated that many modifications and changes may be made by those of ordinary skill in the art without departing from the spirit of the invention.

In summary, the voltage level conversion circuit of the present invention can prevent the generation of leakage currents by disposing the first connection transistor and the second connection transistor. The feeding of the input voltage through the source of the first N-type driving transistor and the second N-type driving transistor can also increase the operation speed. Further, by using the output circuit, the voltage level conversion circuit can supply a stable default voltage when the first power supply source does not turn on.

It is appreciated that the voltage level conversion circuit that converts a voltage from a low level to a high level is used as an example in the embodiments described above. In other embodiments, the technology described above can be applied to the voltage level conversion circuit that converts a voltage from a high level to a low level.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A voltage level conversion circuit, comprising:
   a first N-type driving transistor and a second N-type driving transistor each comprising a gate, a drain and a source, wherein the gate is electrically couple to a first power supply source such that the first N-type driving transistor and the second N-type driving transistor turn on when the first power voltage source supplies a first high state voltage;
   a voltage transmission circuit configured to transmit a first input voltage to the source of the first N-type driving transistor, and transmit a second input voltage to the source of the second N-type driving transistor, wherein levels of the first input voltage and the second input voltage are opposite to each other;
   a current source configured to operate according to a second high state voltage supplied by a second supply voltage source, and having a first output terminal and a second output terminal; and
   a first connection transistor and a second connection transistor, wherein the first connection transistor is electrically coupled between the drain of the first N-type driving transistor and the second output terminal, and the second connection transistor is electrically coupled between the drain of the second N-type driving transistor and the first output terminal;
   wherein the first connection transistor and the second connection transistor are controlled by an enabling voltage such that the first connection transistor and the second connection transistor turn on when the first power supply source supplies the first high state voltage to generate an output voltage, and turn off when the first power supply source supplies a low state voltage;

wherein the enabling voltage switches to an enabling state after the first power supply source starts to supply the first high state voltage for a predetermined time period, and the enabling voltage switches to a disabling state immediately after the first power supply source starts to supply the low state voltage.

2. The voltage level conversion circuit of claim 1, wherein the second high state voltage is larger than the first high state voltage.

3. The voltage level conversion circuit of claim 1, further comprising an output circuit configured to generate an actual output voltage under the control of the enabling voltage, wherein output circuit outputs the output voltage as the actual output voltage when the first power supply source supplies the first high state voltage, and the output circuit outputs a default voltage actual output voltage when the first power supply source supplies the low state voltage.

4. The voltage level conversion circuit of claim 3, wherein the output circuit operates according to the second high state voltage supplied by the second power supply source.

5. The voltage level conversion circuit of claim 3, wherein each of the first connection transistor and the second connection transistor is an N-type transistor, and the output circuit comprises:
 a NAND gate configured to receive the output voltage and the enabling voltage and output a gate output voltage; and
 an inverter configured to receive the gate output voltage and output the actual output voltage.

6. The voltage level conversion circuit of claim 3, wherein each of the first connection transistor and the second connection transistor is a P-type transistor, and the output circuit further comprises:
 a NOR gate configured to receive the output voltage and the enabling voltage and output a gate output voltage; and
 an inverter configured to receive the gate output voltage and output the actual output voltage.

7. The voltage level conversion circuit of claim 1, wherein the voltage transmission circuit comprises:
 a first inverter configured to receive an actual input voltage to generate the first input voltage; and
 a second inverter configured to receive the first input voltage to generate the second input voltage;
 wherein the first inverter and the second inverter operate according to the first high state voltage supplied by the first power supply source.

8. The voltage level conversion circuit of claim 1, wherein the voltage transmission circuit comprises:
 a receiving terminal configured to receive an actual input voltage and directly output the actual input voltage as the second input voltage; and
 an inverter configured to receive the actual input voltage to generate the first input voltage;
 wherein the inverter operates according to the first high state voltage supplied by the first power supply source.

9. The voltage level conversion circuit of claim 1, wherein the current source comprises:
 a first P-type transistor comprising a gate, a drain and a source, wherein the gate is electrically coupled to the first output terminal, the source is electrically coupled to the second power supply source and the drain is electrically coupled to the second output terminal; and
 a second P-type transistor comprising a gate, a drain and a source, wherein the gate is electrically coupled to the second output terminal, the source is electrically coupled to the second power supply source and the drain is electrically coupled to the first output terminal.

\* \* \* \* \*